United States Patent
Yman

(10) Patent No.: US 6,699,355 B2
(45) Date of Patent: Mar. 2, 2004

(54) METHOD AND MEANS FOR EXPOSING COMPONENTS IN A COMPONENT CARRIER TAPE

(75) Inventor: Niclas Yman, Ekero (SE)

(73) Assignee: Mydata Automation AB, Bromma (SE)

( * ) Notice: Subject to any disclaimer, the term of this patent is extended or adjusted under 35 U.S.C. 154(b) by 0 days.

(21) Appl. No.: 10/235,546

(22) Filed: Sep. 6, 2002

(65) Prior Publication Data

US 2003/0049109 A1 Mar. 13, 2003

(30) Foreign Application Priority Data

Sep. 7, 2001 (SE) .............................................. 0103001

(51) Int. Cl.$^7$ ................................................. B65H 5/28
(52) U.S. Cl. ........................ 156/344; 156/584; 221/25; 221/72; 221/87; 414/411; 414/416
(58) Field of Search ................................ 156/344, 584; 221/25, 72, 73, 79, 87; 226/120, 139; 414/411, 416, 425

(56) References Cited

U.S. PATENT DOCUMENTS

| 4,820,369 A | 4/1989 | Kubo |
| 5,839,637 A | 11/1998 | Kanai |
| 6,162,007 A | 12/2000 | Witte |
| 6,402,452 B1 * | 6/2002 | Miller et al. ................. 414/412 |
| 6,619,526 B1 * | 9/2003 | Souder, Jr. ................... 226/151 |

FOREIGN PATENT DOCUMENTS

| EP | 0 963 149 A1 | 12/1999 |
| WO | 00/38491 | 6/2000 |

* cited by examiner

Primary Examiner—Mark A. Osele
(74) Attorney, Agent, or Firm—Birch, Stewart, Kolasch & Birch, LLP

(57) ABSTRACT

A method and means for exposing components (13) positioned in sequence in a carrier tape (7) and covered by a cover tape (8), in order to release and lift the cover tape from the carrier tape and expose the components in a picking position (12) for subsequent picking by a pick-up head in a component mounting machine. Comprising steps and means for continuously directing and discharging any released debris such that accumulation of debris is prevented.

13 Claims, 3 Drawing Sheets

METHOD AND MEANS FOR EXPOSING COMPONENTS IN A COMPONENT CARRIER TAPE

TECHNICAL FIELD OF THE INVENTION

The present invention generally relates to the field of manufacture and assembly of circuit boards. More specifically it relates to a method and means for exposing components contained in compartments in a carrier tape and covered by a cover tape, including releasing and lifting of a lateral portion of the cover tape from the carrier tape.

TECHNICAL BACKGROUND AND PRIOR ART

Generally, within the field of manufacture and assembly of circuit boards, electronic components are fed to a component mounting machine for mechanically and/or electrically mounting the components onto circuit boards. These surface mounted components are often delivered spaced apart along the length of a component tape, which consists of a lower carrier tape provided with compartments, one for each component, and an upper cover, or cover tape or protective tape. After positioning the electronic components in the corresponding compartments, the cover tape is attached to the carrier tape, and the component tape is wound on a component reel. The attachment of the cover tape to the carrier tape can, for instance be performed by providing either the cover tape or the carrier tape with adhesive areas, or by fusing the cover tape to the carrier tape.

When mounting the components on the circuit board, a component reel is positioned at a component mounting machine and the component tape is fed to the machine via a tape guide, where the cover tape is released and lifted from the carrier tape at a lateral portion, so as to expose each component in a picking position where it can be picked up and mounted on the circuit board.

The tape guide, where the components are exposed, can optionally be integrated with a complete feeding device, including a tape magazine and a feeding mechanism.

However, the tape guide can also be of a kind disclosed in WO 00/38491 which is incorporated hereby by reference. The tape guide disclosed in this-document is in the form of an adapter with the ability to perform loading and/or unloading of a component tape into and from the tape guide, remote from the component mounting machine. The component tape reel and the tape guide can thus be easily and quickly releasable mounted to the component mounting machine.

For separating the cover tape from the carrier tape, the separating means, according to WO 00/38491, is provided with a tip portion. Said tip portion protrudes backwards against the feeding direction of the component tape and is located between the carrier tape and the cover tape in the region above the compartments in the carrier tape. The tip portion of the separating means is formed with a wing portion, which extends in an oblique angle in the direction forward/sideways in relation to the feeding direction, toward the side of the component tape where the cover is being released from the carrier tape. On each side of the component tape, there is a tape guiding wall of which the separating means is attached to the tape guiding wall on the same side as the cover tape is being released. When feeding the component tape forward, the wing portion accordingly will split and release the cover tape from the carrier tape at one side of the compartments in the carrier tape.

From the releasing position at the wing portion, the lifting of the carrier tape by folding it along the unreleased portion, must be performed over an extended length until the compartments are fully exposed and access is made to the components. For this reason the separating means is combined with a cover means, ranging from the tip portion to the picking position, in close proximity to the upper surface of the carrier tape. The cover means prevents components from escaping from the compartments due to vibrations and the like, until they have reached the picking position. To enhance the bearing contact between the carrier tape and the cover means, the tape guide preferably is provided with a spring actuated contact means which bear against a lower surface of the carrier tape, pressing it against the cover means.

However, during operation with a tape guide according to WO 00/38491, it has been experienced that the friction between the component tape and the cover tape sometimes is so high that the feeding mechanism is not capable of feeding the component tape through the tape guide. It has also occurred that components have escaped from the compartments in the region between the tip portion and the picking position, though the contact means is pressing the carrier tape against the cover means. However, it is not an option available to enhance the pressing force further to ensure proper contact between the carrier tape and the cover means, since this also would increase the friction further.

SUMMARY OF THE INVENTION

It is an object of the invention to provide a solution to the problems and drawbacks experienced in the prior art, in form of high friction and components escaping from the carrier tape prior to reaching the picking position. This and other objects are achieved according to the present invention by providing a method and a means or device for exposing components having the features defined in the independent claims. Preferred embodiments are defined in the dependent claims.

For the purpose of clarity the term lateral refers to the lateral direction of the carrier tape. The terms backward and forward refer to the direction opposite and along the feeding direction of the carrier tape, respectively.

The present invention is based on the insight that the problems and draw-backs of the prior art emanate from the fact that debris, for example in the form of fibers and/or glue from the carrier tape, the cover tape and the adhesive therebetween, collects on the edges and surfaces of the separating means or member and the cover means or member. On one hand this causes enhanced friction since the debris on the edges and surfaces tend to slow down the feeding motion of the component tape. On the other hand the debris collected on edges that are not perpendicular but have an oblique angle in relation to the feeding direction, such as the wing portion, tend to guide and direct the debris laterally where it may be accumulated in corners, folds, yokes and the like of the separating means and cover means, into small granules or particles. These particles cause enhanced friction to the feeding motion as long as they are adhered to the separating means and cover means, but may also cause depression of the carrier tape by pressing the carrier tape downwards, especially if they come loose and follow the carrier tape during feeding in the region between the carrier tape and the separating/cover means . Such depression causes a clearance between the carrier tape and the separating/cover means through which components may escape.

According to the invention, the objects are achieved by avoiding accumulation of the debris in any corners, folds, yokes and the like, but instead effect continuous guiding and discharging of the debris. In the preferred embodiment this is performed in the lateral direction, such that the debris may fall out beyond the outer periphery of the carrier tape, or in the feeding direction, such that it follows the feeding motion of the tape through clearances between the separating/cover means.

According to a preferred embodiment of the invention, the wing portion is extended in the lateral direction, such that it reaches beyond the lateral edge of the component tape. This assures that released debris is guided by the wing portion in lateral direction for discharging outside of the carrier tape. The tape guide according to the preferred embodiment is of a kind where the component tape is guided between two opposed, vertical wall elements. To allow debris to be discharged outside of the tape guide, and not being accumulated inside of the same, the wall element on the release side of the component tape, i.e. the same side as the wing portion, is formed with an opening in the region where the lateral portion of the oblique angled edge of the wing portion meets the wall element, through which debris may escape. It would however be possible to let the wing portion be terminated above the carrier tape before it reaches beyond the lateral edge of the tape, under condition that measures are taken downstream of the wing portion so that debris left on the carrier tape do not accumulate, and under condition of course that the wing portion is capable of releasing the cover tape completely along one side. Since the cover tape often is adhered along a narrow path on each side of the compartments, this would be possible even though the wing portion does not reach beyond the lateral edge of the carrier tape.

In the preferred embodiment there is also arranged a clearance in form of a passage or channel in or immediately lateral from a surface of the cover means. The channel is directed along the feeding direction and is positioned in the region where the separating and cover means is attached to the wall element. In the attachment area between the separating and cover means and the wall element, a corner or yoke is formed in a portion rearmost against the feeding direction. This spot is a place where debris may accumulate. By arranging the channel, according to the invention, this risk is eliminated such that when released debris, for instance by the tip portion, is guided towards the corner, it can continuously and without accumulating be transferred via the channel through the tape guide.

The channel is located in a region outside the compartments in the carrier tape and preferably the channel coincides with the narrow path where the cover tape has been attached to the carrier tape. This is favorable since possible residues from glue may cause accumulation of particles and increased friction if it is transferred through the tape guide in contact with the cover means.

One way in which the debris is formed is when edges of the separating and cover means that are faced backwards against the feeding direction, scrape against the upper surface of the carrier tape. For this reason it is preferred, according to the invention, that clearances are provided such that edges that are not parallel to the feeding direction is formed with an upwardly bent edge portion, such that said edge do not bear and scrape against the carrier tape.

It is clear that the invention can be carried out in many different ways within the scope of the following claims. The preferred embodiment of the invention is provided with a combination of all the facilities described above. However, it should be understood that other embodiments can have just one or a few of these facilities in any combination, or even facilities not mentioned here for discharging of debris from the tape guide, without departing from the scope of the invention. In the hereafter described, preferred embodiment, the exposure means or device is integrated into one unit. However, it would also be possible to let, for instance the separating means and the cover means, be separate units which are combined.

Further details and aspects of the invention will become apparent from the following detailed description of embodiments of the invention, reference being made to the accompanying drawings, wherein like reference numerals refer to similar parts throughout.

DETAILED DESCRIPTION OF A PREFERRED EMBODIMENT

Figure 1:
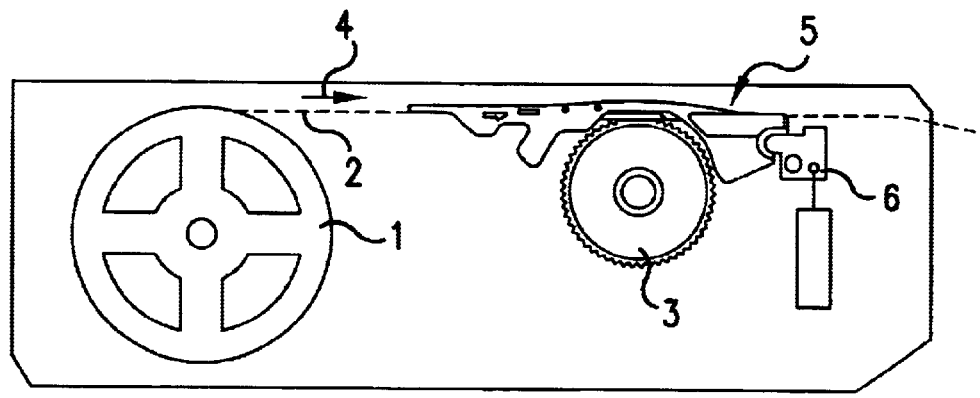
FIG. 1 is a schematic side view of a feeding device including a tape guide according to the invention.

FIG. 1 is a schematic illustration of a feasible embodiment of a feeding device for feeding of components, contained in a component tape, to a component mounting machine and subsequent mounting on circuit boards. The feeding device is releasable mounted in a component mounting machine and includes a tape reel 1 onto which a component tape 2 is wound. A feeding mechanism, in the form of a sprocket 3, feeds the component tape to the right in the drawing, in the direction of arrow 4, by engagement of sprocket teeth in the component tape. During feeding, the component tape is passed through a tape guide 5, which is releasable mounted in the feeding device and hold in position by a locking mechanism 6.

Figure 2:
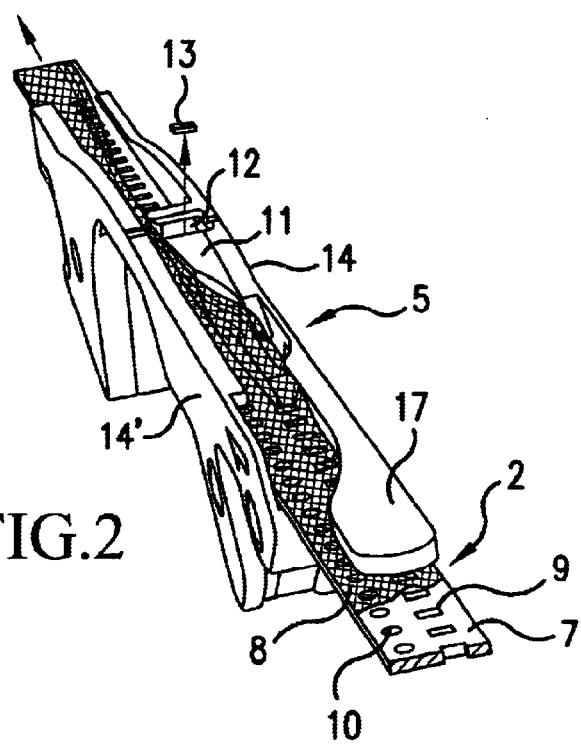
FIG. 2 is a perspective view from above of the tape guide in FIG. 1, illustrated with a piece of a component tape inserted.

In FIG. 2 the tape guide 5 is shown, in a perspective view from above, together with a piece of the component tape 2. The component tape is built up of a carrier tape 7 and a cover tape 8. The carrier tape 7 including compartments 9 for containing components and engagement holes 10 to be engaged by the sprocket teeth. The component tape has preferably also a lower tape, which is not shown in the drawings, to prevent the components from falling through the carrier tape, since the compartments normally are formed from holes passing through the carrier tape. The component tapes are delivered with one component in each compartment and the cover tape 8 sealed over the compartments, suitably by gluing or welding along a narrow path on each side of the compartments.

During feeding of the component tape through the tape guide 5, it passes an exposure means or device 11, which releases one side of the cover tape 8 from the carrier tape and folds the released portion of the cover tape to an upright position. While the cover tape is in the upright position, the components are exposed in sequence at a picking position 12 where the components can be picked by a pick-up head, as illustrated in the drawing by a component 13.

Figure 3:
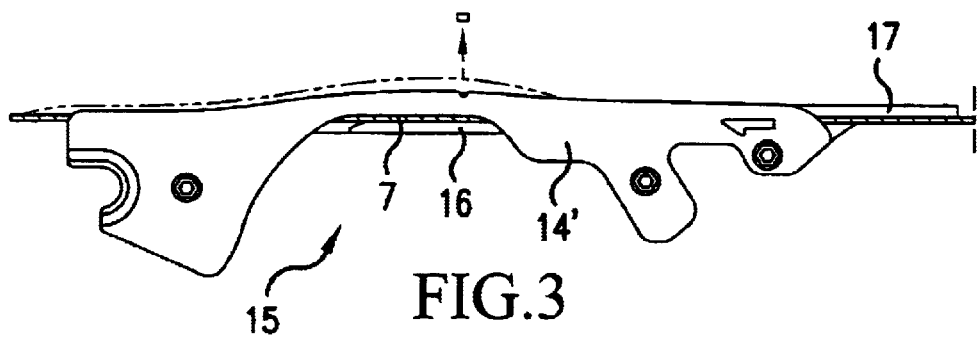
FIG. 3 is a side view of the tape guide from the left side in FIG. 2.
Figure 4:
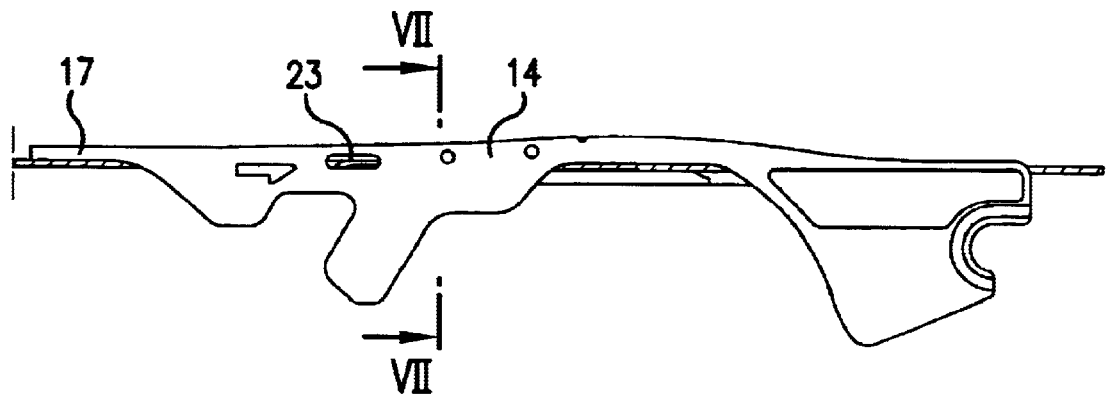
FIG. 4 is a side view of the tape guide from the right side in FIG. 2.

Generally, the tape guide 5 comprises an elongated open-ended profile with opposing elongated tape guiding wall elements 14, 14', which are visible from outside in FIGS. 3 and 4. In a middle portion, the tape guide 5 is formed with a recess 15 where access is made to the bottom of the carrier tape 7 to allow for engagement of the sprocket teeth to the engagement holes 10. Also, a resilient support spring 16 is arranged in the middle portion for pressing the carrier tape 7 upwards against the bottom of the exposure means. A handle 17 is arranged in one end of the tape guide to facilitate attachment and detachment of the tape guide into and from the component mounting machine.

Figure 5:
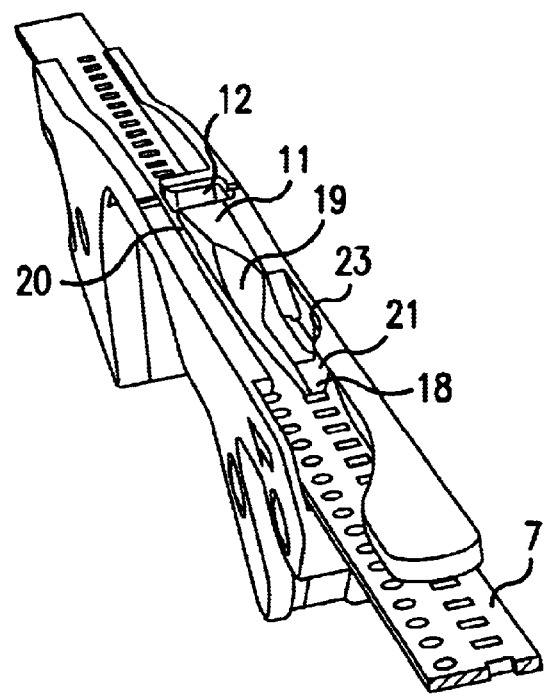
FIG. 5 is a perspective view similar to FIG. 2 but with the cover tape removed for the sake of clarity.
Figure 6:
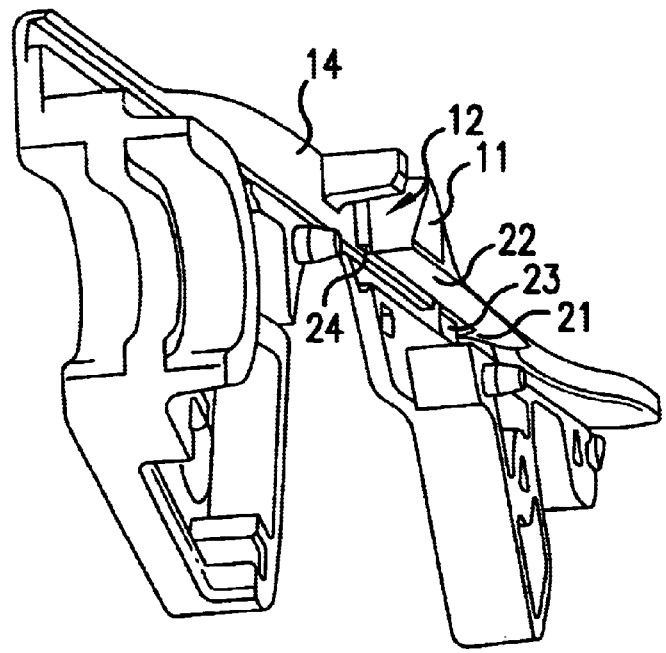
FIG. 6 is a perspective view from beneath of a tape guide, which has been divided in the longitudinal direction, and showing the inside surface of a wall element.

FIG. 5 is a perspective view similar to FIG. 2, but here the cover tape 8 is removed for better visibility of the exposure means 11. For the following explanation of the structure of the exposure means 11, reference is also made to FIG. 6, where the exposure means is seen from below in a perspective view of the inside of the wall element 14, and to FIG. 7 where the exposure means is seen in cross section along the line VII—VII in FIG. 4.

The exposure means 11 comprises a separating means or member including a tip portion 18, for releasing a lateral portion of the cover tape 8 from the carrier tape 7, and a cover tape guiding surface 19, with an obliquely angled and curved guiding surface for lifting the released lateral portion of the cover tape to an upright position when passing a passage 20 between the exposure means 11 and the wall element 14' in the region of the picking position 12. The tip portion 18 is directed backwards against the feeding direction of the component tape and is thin at a rear edge with a growing thickness in the forward direction, and is formed with a wing portion 21 diverging in the forward direction through an edge which is extended obliquely forward/sideways toward the wall element 14. The wing portion 21 is extended beyond the lateral edge of the carrier tape 7. The lower surface of the exposure means is forming a cover means or member 22 ranging from the tip portion 18 to the picking position 12. The cover means 22 has the purpose of covering the compartments 9, after releasing and lifting of the cover tape, and prevent escaping of the components, due to vibrations and the like, until they have reached the picking position. The carrier tape 7 is pressed against the cover means 22 by the resilient support spring 16.

During operation, the tip portion protrudes into the space between the carrier tape 7 and the cover tape 8, and during subsequent forward feeding of the component tape 2, the edge of the wing portion 21 releases the cover tape 8 from the carrier tape 7. Any released debris, such as glue and/or fibers from the carrier tape or cover tape, during this releasing operation, is directed sideways by the obliquely extended edge of the wing portion, and is discharged beyond the lateral edge of the component tape. To facilitate discharging of the debris from the component tape and the exposure means, there is an opening 23 in the wall element 14 in the region where the wing portion meets the wall element. Accordingly, released debris may be discharged outside of the tape guide 5.

Figure 7:
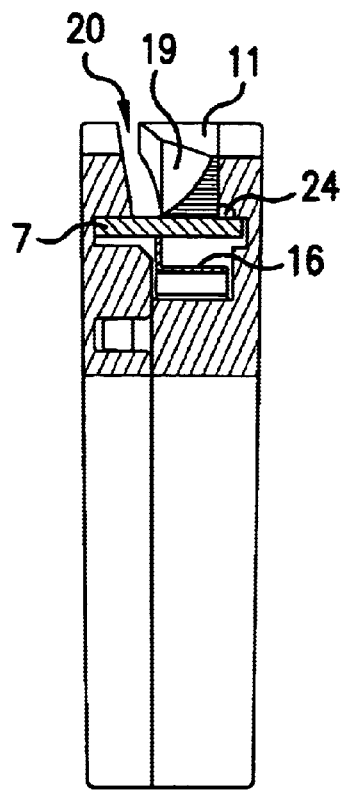
FIG. 7 is a cross sectional view along line VII—VII in FIG. 4.

Immediately forward of the wing portion 21, the exposure means 12 is narrowing and a distance forward from the wing portion it is attached to the wall element 14. At the attachment area between the exposure means 12 and the wall element 14, the wall element is reinforced and has a larger wall thickness as can be seen in FIG. 7. Since the rearmost portion of the attachment area between the exposure means and the wall element is forming a corner with a transverse edge faced toward the feeding direction of the component tape, this portion is susceptible to accumulation of debris. Especially since the reinforced wall portion has a sharp corner in this area. To prevent accumulation of debris in this area, there is provided a clearance in form of a channel or passage 24, immediately lateral of the cover means 22, which is ranging continuously to the picking position in parallel to the feeding direction. Accordingly, the cover means 22 present a straight lateral edge parallel to the feeding direction such that any debris may pass through the tape guide, eliminating the risk of accumulating into granules or particles which would cause problems.

Besides clearances in form of a channel or passage 24, the exposure means, according to the preferred embodiment, exhibit clearances in form of upwardly bent edge portions on all edges that are not parallel to the feeding direction, but have a transverse extension in relation to the feeding direction and are faced backwards against the feeding direction. Examples of such surfaces are the edge of the tip portion is, the edge of the wing portion and the rearmost edge at the attachment area between the exposure means and the wall element 14. In this way these edges will not scrape against the upper surface of the carrier tape 7 and release debris themselves, and at the same time will any debris that arrives to these edges not accumulate but be transferred via the clearances through the tape guide between the carrier tape and the exposure means. These clearances in form of upward bent edge portions are not shown in the drawings.

What is claimed is:

1. Method for exposing components positioned in sequence in compartments (9) in a carrier tape (7) and covered by a cover tape (8), in order to release and lift the cover tape from the carrier tape and expose the components in a picking position (12) for subsequent picking by a pick-up head in a component mounting machine, comprising the steps of intermittently feeding the carrier tape through a tape guide (5), releasing and lifting the cover tape from the carrier tape by means of a separating member, characterized by continuously directing and discharging any released debris such that accumulation of debris in the tape guide is prevented.

2. Method according to claim 1, comprising the steps of releasing and lifting a lateral portion of the cover tape from the carrier tape by means of a separating member (18, 19, 21), while leaving an opposite lateral portion of the cover tape at least partially attached to the carrier tape, and bringing the lifted portion of the cover tape aside, preventing exposure and possible loss of components from the carrier tape after releasing and lifting of the cover tape by a cover member (22) positioned in close proximity to the cover tape in the area forward from the separating member until the components arrive at the picking position, characterized by continuously directing and discharging any released debris in the lateral direction or in the direction of the tape travel through clearances (24) between the cover member (22) and the carrier tape (7).

3. Method according to claim 2, characterized by pressing the carrier tape toward the lower surface of the cover member (22).

4. Method according to claim 2, characterized by directing and discharging the debris in the lateral direction beyond the lateral edge of the carrier tape (7).

5. Exposure device for exposing components (13) positioned in sequence in compartments (9) in a carrier tape (7)

and covered by a cover tape (8), in order to release and lift the cover tape from the carrier tape to expose the components in a picking position (12) for subsequent picking by a pick-up head in a component mounting machine, comprising a separating member (18, 19, 21) for releasing and lifting the cover tape from the carrier tape, characterized in that the exposure device comprises facilities for continuously directing and discharging of debris such that accumulation of debris at the exposure device is prevented.

6. Exposure device according to claim 5, comprising separating means (18, 19, 21) for releasing and lifting a lateral portion of the cover tape from the carrier tape while leaving an opposite lateral portion of the cover tape at least partially attached to the carrier tape, and bringing the lifted portion of the cover tape aside a cover member (22) positioned in close proximity to the upper surface of the carrier tape in a region forward from the separating member for covering the component filled compartments and thereby preventing exposure and possible loss of components from the carrier tape in the region between the releasing position and the picking position, characterized in that the exposure device comprises facilities for continuously directing and discharging of debris in the lateral direction or in the direction of the tape travel through clearances (24) between the separating/cover members (18, 21, 22) and the carrier tape (7).

7. Exposure device according to claim 5, characterized in that the exposure device is located in a tape guide (5).

8. Exposure device according to claim 7, characterized in that the exposure device is attached to a wall element (14) of the tape guide (5) within the vertical boundaries of the carrier tape (7).

9. Exposure device according to claim 5, characterized in that it comprises a wing portion (21) which is extended beyond the lateral edge of the carrier tape (7).

10. Exposure device according to claim 5, characterized in that it comprises a clearance in form of a passage (24) in or immediately lateral of the cover member (22), which extends in parallell to the feeding direction to the picking position (12).

11. Exposure device according to claim 5, characterized in that it comprises clearances in form of upwardly bent surfaces at edges on the separating or cover members that have an extension in lateral direction and are faced backwards against the feeding direction.

12. Exposure device according to claim 5, characterized in that there is an opening (23) in the wall element (14) at same side as where the cover tape (8) is being released and in the region where the wing portion (21) meets the wall element.

13. Tape guide comprising an exposure device according to claim 5.

* * * * *